(12) United States Patent
Tsunoda et al.

(10) Patent No.: US 7,371,595 B2
(45) Date of Patent: May 13, 2008

(54) METHOD FOR MANUFACTURING SEMICONDUCTOR LASER DEVICE

(75) Inventors: Atsuo Tsunoda, Higashihiroshima (JP); Akiyoshi Sugahara, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/262,548

(22) Filed: Oct. 28, 2005

(65) Prior Publication Data

US 2006/0094141 A1 May 4, 2006

(30) Foreign Application Priority Data

Oct. 29, 2004 (JP) .............................. 2004-316610

(51) Int. Cl.
  *H01L 21/00* (2006.01)
(52) U.S. Cl. .......................................... 438/40; 438/39
(58) Field of Classification Search ................ 438/39, 438/40, 41, 42, 43, 44
  See application file for complete search history.

(56) References Cited

U.S. PATENT DOCUMENTS

2005/0100067 A1* 5/2005 Tsunoda ...................... 372/45

FOREIGN PATENT DOCUMENTS

JP 2002-198614 A 7/2002
JP 2004055587 * 2/2004

* cited by examiner

*Primary Examiner*—B. William Baumeister
*Assistant Examiner*—Matthew L. Reames
(74) *Attorney, Agent, or Firm*—Morrison & Foerster LLP

(57) ABSTRACT

A method for manufacturing a semiconductor laser device is provided in which deformation of a cap layer and a third cladding layer is inhibited and a protruding portion of an intermediate layer is removed. By coating outer peripheral portions facing an intermediate layer of a third cladding layer and an etching stop layer with a resist, inevitably removing at least the third cladding layer, and etching the intermediate layer and a cap layer in a second etching step, a protruding portion of the intermediate layer is removed, and the cap layer is prevented from being etched undesirably, whereby a ridge portion without irregularities with respect to a direction substantially perpendicular to a lamination direction is produced, and increase of an operation voltage and decrease of external differential quantum efficiency are prevented.

5 Claims, 9 Drawing Sheets

METHOD FOR MANUFACTURING SEMICONDUCTOR LASER DEVICE

CROSS-REFERENCE TO RELATED APPLICATION

This application claims priority to Japanese Patent Application No. JP 2004-316610, which was filed on Oct. 29, 2004, and the contents of which are incorporated herein by reference, in their entirety.

BACKGROUND OF THE INVENTION

1. Field of the Invention

The present invention relates to a method for manufacturing a semiconductor laser device having a ridge portion. In the invention, a term "substantially perpendicular" includes "perpendicular."

2. Description of the Related Art

Semiconductor laser devices, for example, AlGaInP red semiconductor laser devices that oscillate at 600 nm band are used as a light source for optical information processing of a pointer, a bar code reader, a laser beam printer, an optical disk and the like. Semiconductor laser devices such applied are required to emit a higher power laser beam and with increasing the laser beam power exhibit capability of high-temperature operation even in a high-temperature environment, for example, in order to realize increase of writing speed into an optical disk. A real refractive index guided laser having a dielectric ridge embedded structure is effective in manufacture of a high power laser. Hitherto, a method for manufacturing a semiconductor laser device of dielectric ridge embedded structure has been practically used (refer to Japanese Unexamined Patent Publication JP-A 2002-198614).

Figure 5:
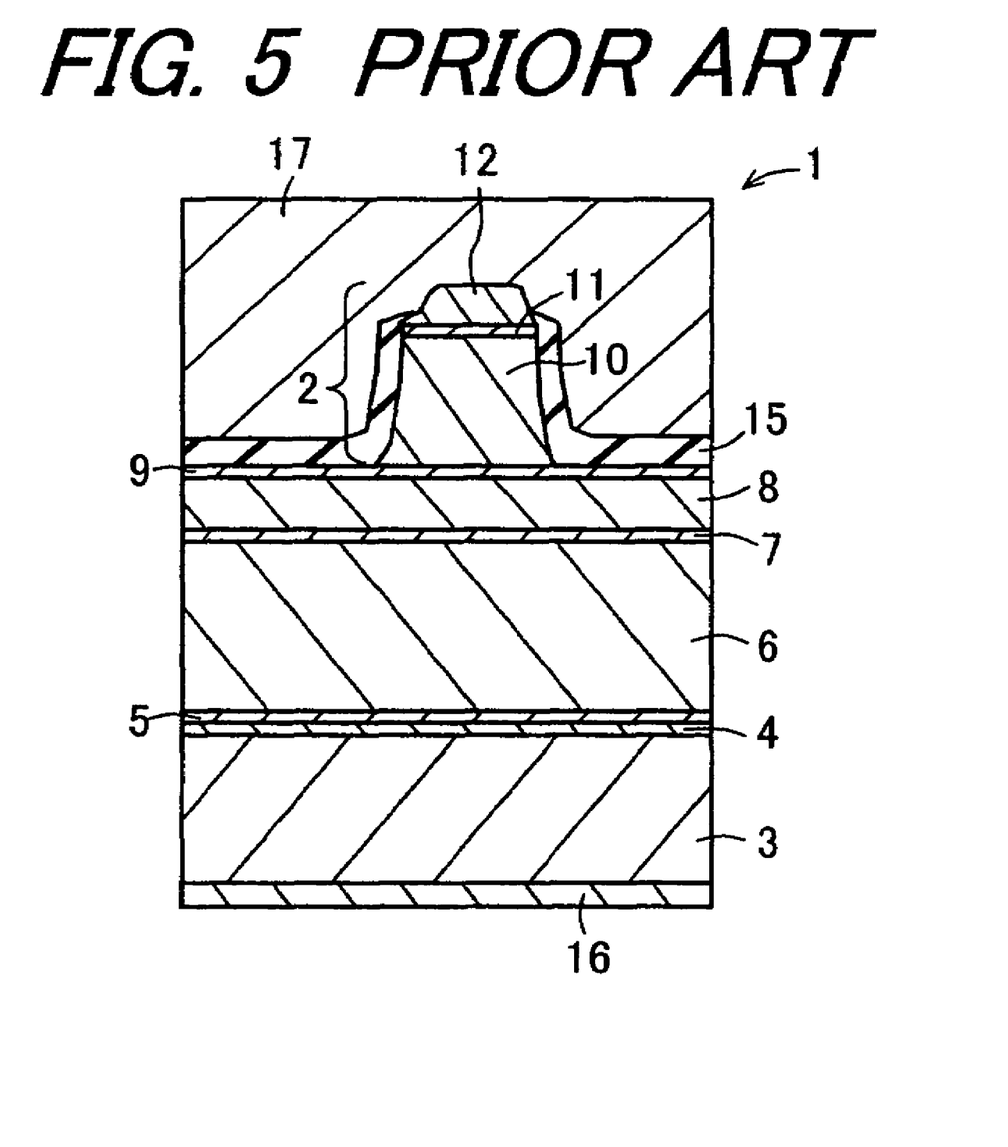
FIG. 5 is a sectional view showing a semiconductor laser device manufactured by a conventional method for manufacturing the AlGaInP red semiconductor laser device that has the dielectric ridge embedded structure.
Figure 6:
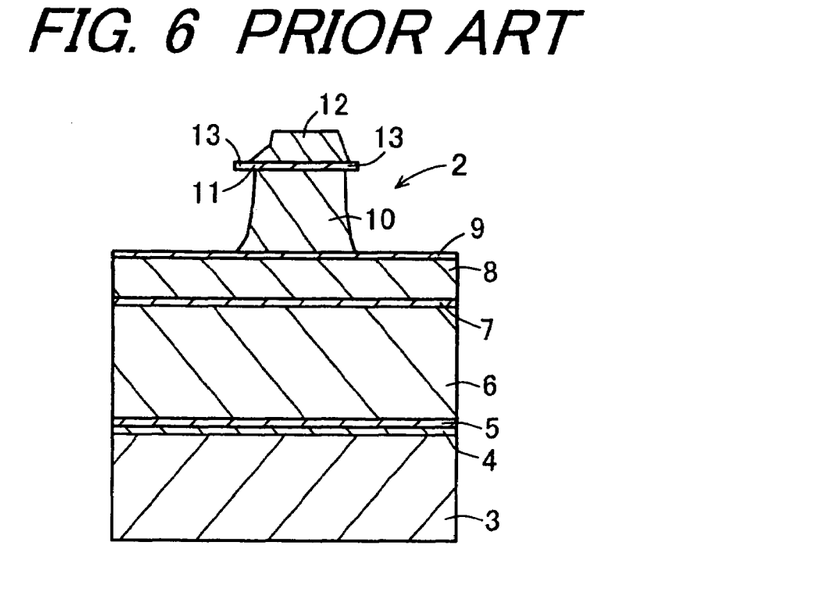
FIG. 6 is a sectional view showing a state where a ridge portion is formed in the conventional method for manufacturing the semiconductor laser device.
Figure 7:
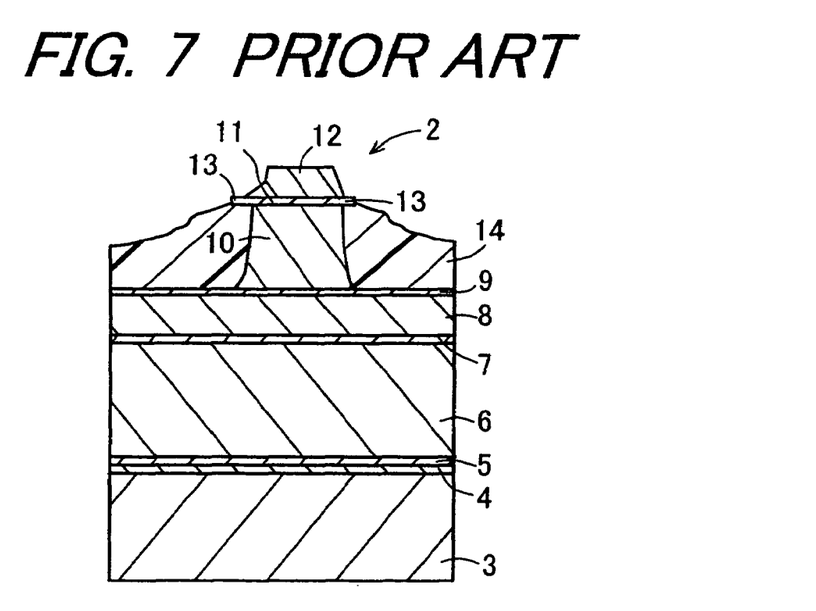
FIG. 7 is a sectional view showing a state prior to removal of part of the ridge portion in the conventional method for manufacturing the semiconductor laser device.

FIG. 5 is a sectional view showing a semiconductor laser device 1 manufactured by a conventional method for manufacturing an AlGaInP red semiconductor laser device 1 of the dielectric ridge embedded structure (hereinafter, may be simply referred to as "the method for manufacturing the semiconductor laser device"). FIG. 6 is a sectional view showing a work in step where a ridge portion 2 is formed in the conventional method for manufacturing the semiconductor laser device 1. FIG. 7 is a sectional view showing a work in step prior to removal of part of the ridge portion 2 in the conventional method for manufacturing the semiconductor laser device 1. In the method for manufacturing the semiconductor laser device 1, firstly, an n-type GaAs buffer layer 4, an n-type GaInP buffer layer 5, an n-type AlGaInP cladding layer 6, a GaInP/AlGaInP multiple quantum well active layer 7, a p-type first AlGaInP cladding layer 8, a GaInP etch stop layer 9, a p-type second AlGaInP cladding layer 10, a p-type GaInP intermediate layer 11 and a p-type GaAs cap layer 12 are sequentially laminated on an n-type GaAs substrate 3. Subsequently, part of the p-type GaAs cap layer 12, the p-type GaInP intermediate layer 11 and the p-type second AlGaInP cladding layer 10 is dry-etched, and UV-$O_3$ ashing is performed for the purpose of oxidizing adherents adhering to the surface of crystal after etching.

Subsequently, the p-type GaAs cap layer 12 is side-etched with an etching solution of a sulfuric acid and hydrogen peroxide solution base. Then, as surface treatment for stably performing the following etching, immersion into buffered hydrofluoric acid is performed to rinse. Subsequently, the p-type second AlGaInP cladding layer 10 is wet-etched until etching stops on the GaInP etch stop layer 9 to form the ridge portion 2. As shown in FIG. 6, the ridge portion 2 has a protruding portion 13 formed into a visor shape of the p-type GaInP intermediate layer 11.

Subsequently, a resist 14 is applied, instant exposure is exposed, only a part on one side in a lamination direction from the p-type GaInP intermediate layer 11 of the ridge portion 2 is exposed as shown in FIG. 7, and etching is performed by using the resist 14 as a mask, whereby the protruding portion 13 is removed. As an etching solution therefor, a mixture of phosphoric acid, hydrochloric acid and a hydrogen peroxide solution is used.

Subsequently, a dielectric film, for example, a $SiO_2$ film 15 is evaporated on the outer peripheral portion of the ridge portion 2, and the $SiO_2$ of one end portion in the lamination direction of the ridge portion 2 is removed by etching by photolithography. At last, electrodes 16, 17 are formed on both the end surface portions in the lamination direction, respectively, whereby the AlGaInP red semiconductor laser device 1 having the dielectric embedded ridge structure as shown in FIG. 5 is obtained.

Figure 8A:
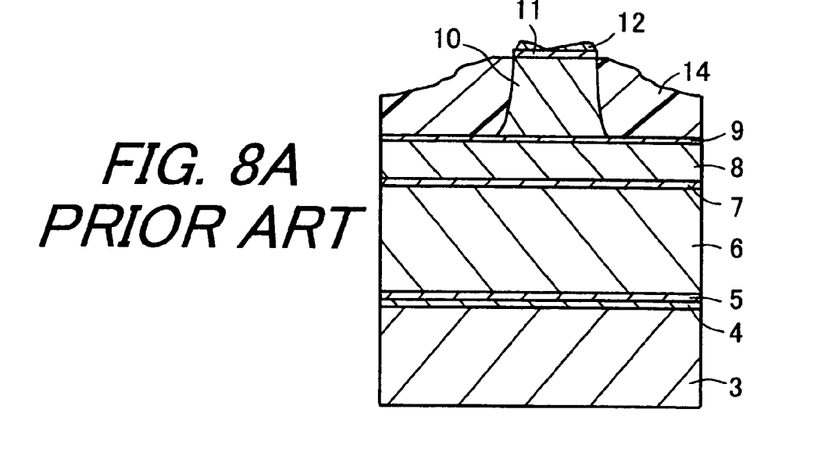
FIG. 8A is a sectional view showing a state where the p-type GaAs cap layer is removed undesirably.
Figure 8B:
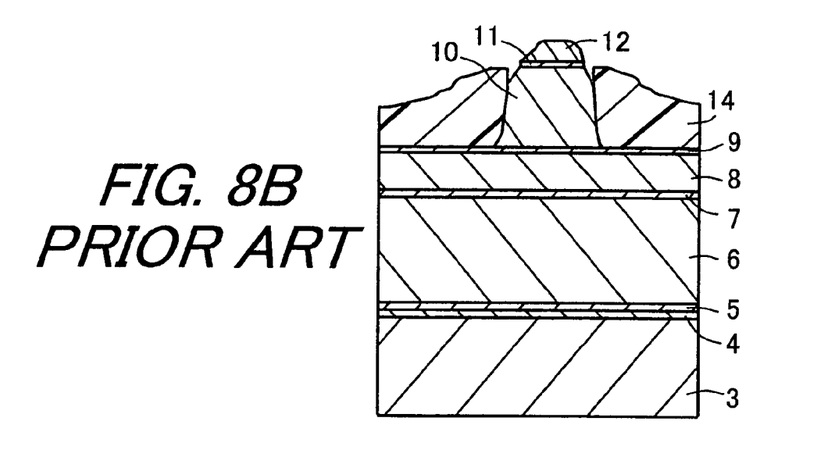
FIG. 8B is a sectional view showing a state where the p-type second AlGaInP cladding layer 10 is etched undesirably.
Figure 8C:
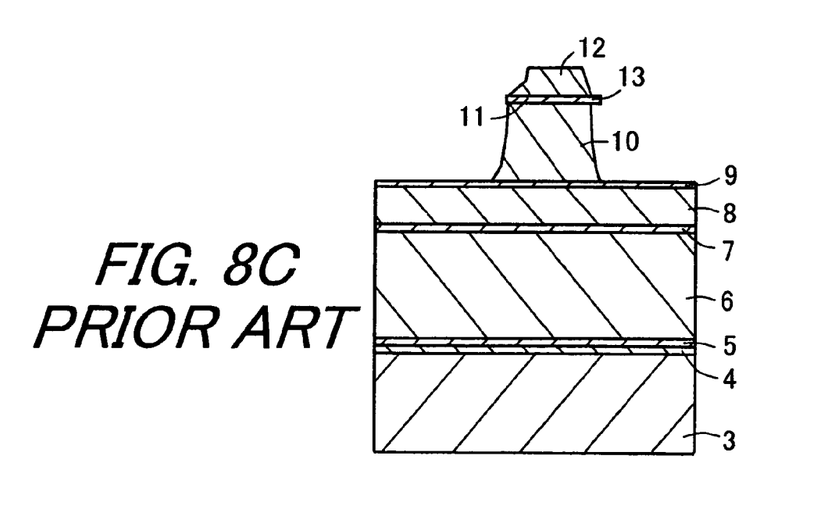
FIG. 8C is a sectional view showing a state where the base of the protruding portion 13 is not removed undesirably.

FIGS. 8A to 8C are sectional views showing states where abnormalities occur in the case where part of the ridge portion 2 is removed in the method for manufacturing the semiconductor laser device 1, FIG. 8A is a sectional view showing a state where the p-type GaAs cap layer 12 is removed undesirably, FIG. 8B is a sectional view showing a state where the p-type second AlGaInP cladding layer 10 is etched undesirably, and FIG. 8C is a sectional view showing a state where the base of the protruding portion 13 is not removed undesirably.

The method to remove the visor-like protruding portion 13 of the p-type GaInP intermediate layer 11 by etching using the mixture of phosphoric acid, hydrochloric acid and a hydrogen peroxide solution in the prior art has the following problem. There are fears that the p-type GaAs cap layer 12 is lost as shown in FIG. 8A, and that resulting from damage of the resist 14 by the etching solution, the etching solution penetrates from a gap of the resist and the p-type second AlGaInP cladding layer 10 is etched as shown in FIG. 8B.

Further, as another method for removing the protruding portion 13, there is a method to physically remove by, for example, giving ultrasonic vibrations to the protruding portion 13 by ultrasonic washing and breaking the protruding portion 13. In this method, there is a fear that the protruding portion 13 is not removed from the base as shown in FIG. 8C, and it is impossible to completely remove the protruding portion 13.

In the case where the p-type GaAs cap layer 12 and the p-type second AlGaInP cladding layer 10 are etched undesirably as described above, when the p-type GaAs cap layer 12 is partially lost, there is a fear that the electrode is formed so as to come into contact with not the p-type GaAs cap layer 12 but the p-type GaInP intermediate layer 11. Thus, there is a problem such that the electrode cannot be appropriately formed, resistance increases, and an operation voltage increases.

In the case where the protruding portion 13 is not completely removed, namely, in the case where a smooth ridge is not formed after removal of the protruding portion 13, a part right under the protruding portion 13 is shaded and the dielectric film 15 is not evaporated. Therefore, the ridge portion 2 cannot be satisfactorily embedded by the dielectric film 15, so that there is a problem such that light leaks out of the not-evaporated part, external differential efficiency decreases and the value of an operation electric current increases.

SUMMARY OF THE INVENTION

Hence, an object of the invention is to provide a method for manufacturing a semiconductor laser device in which a protruding portion of a second-conductive-type intermediate band gap layer is removed while preventing deformation of a second-conductive-type cap layer and a second-conductive-type second cladding layer.

The invention provides a method for manufacturing a semiconductor laser device comprising: a step of sequentially laminating, on a substrate, at least a first-conductive-type cladding layer, an active layer, a second-conductive-type first cladding layer, an etching stop layer, a second-conductive-type second cladding layer, a second-conductive-type intermediate band gap layer and a second-conductive-type cap layer; a step of etching part of the second-conductive-type cap layer, the second-conductive-type intermediate band gap layer and the second-conductive-type second cladding layer; a step of side-etching the second-conductive-type cap layer; a first etching step of etching the second-conductive-type second cladding layer and forming a ridge stripe structure having a protruding portion of the second-conductive-type intermediate band gap layer; and a second etching step of etching and removing the protruding portion that may be formed in the first etching step, the protruding portion being such that the second-conductive-type intermediate band gap layer protrudes in a direction substantially perpendicular to a lamination direction from the second-conductive-type second cladding layer and the second-conductive-type cap layer, wherein the second etching step includes a stage of coating outer peripheral portions facing the second-conductive-type intermediate band gap layer of the second-conductive-type second cladding layer and the etching stop layer with a resist and a stage of inevitably removing at least the second-conductive-type second cladding layer and etching the second-conductive-type intermediate band gap layer and the second-conductive-type cap layer.

According to the invention, the method for manufacturing a semiconductor laser device comprises the step of laminating, the step of etching, the step of side-etching, the first etching step and the second etching step. Through these steps, a semiconductor laser device having the ridge strip structure is manufactured. In the second etching step, the protruding portion that can be formed in the first etching step, the protruding portion being such that the second-conductive-type intermediate band gap layer protrudes in the direction substantially perpendicular to the lamination direction from the second-conductive-type second cladding layer and the second-conductive-type cap layer, is etched and removed.

According to the invention, the second etching step includes the stage of coating the outer peripheral portions facing the second-conductive-type intermediate band gap layer of the second-conductive-type second cladding layer and the etching stop layer with a resist, and the stage of inevitably removing at least the second-conductive-type second cladding layer and etching the second-conductive-type intermediate band gap layer and the second-conductive-type cap layer, with the result that the following effect is produced. It is possible to securely remove only the protruding portion by etching without undesirably etching the second-conductive-type second cladding layer and the second-conductive-type cap layer. That is to say, it becomes possible to inhibit deformation of the second-conductive-type cap layer and the second-conductive-type second cladding layer, and remove the protruding portion of the second-conductive-type intermediate band gap layer. Thus, it is possible to produce a ridge without irregularities with respect to a direction substantially perpendicular to the lamination direction. Therefore, it is possible to prevent increase of an operation voltage and decrease of external differential quantum efficiency. Consequently, it is possible to manufacture a semiconductor laser device that operates at a stable low operation electric current. In specific, it becomes possible to obtain a semiconductor laser device that operates at a stable low operation electric current even in a high-temperature environment accompanying making a laser beam high-power.

Further, in the invention it is preferable that the second-conductive-type intermediate band gap layer is made of GaInP crystals, and the second-conductive-type cap layer is made of GaAs crystals.

According to the invention, the second-conductive-type intermediate band gap layer is made of GaInP crystals, and the second-conductive-type cap layer is made of GaAs crystals, so that it is possible to realize a manufacturing method in which the protruding portion of the second-conductive-type intermediate band gap layer is etched and the remaining portion is not undesirably etched.

Furthermore, in the invention it is preferable that an etching solution used in the second etching step is a mixture of saturated bromine water, phosphoric acid and water.

According to the invention, by using a mixture of saturated bromine water, phosphoric acid and water as the etching solution, it is possible to etch the protruding portion of the second-conductive-type intermediate band gap layer, and prevent the remaining portion from being undesirably etched.

Still further, in the invention, it is preferable that the second etching step further includes a stage of performing optical excitation ashing between the stage of coating with a resist and the stage of etching.

According to the invention, it is possible to remove undesirable extraneous matter, and etch with high accuracy. Consequently, it is possible to prevent the second-conductive-type cap layer from being etched undesirably as far as possible.

Still further, in the invention, it is preferable that a mixture ratio of saturated bromine water, phosphoric acid and water of the etching solution is selected so that an etching rate for etching the second-conductive-type cap layer becomes 0.2 μm/minute or less.

According to the invention, by selecting the etching rate, it is possible to prevent the second-conductive-type cap layer from being etched undesirably, and remove the protruding portion by etching.

BRIEF DESCRIPTION OF THE DRAWINGS

Other and further objects, features, and advantages of the invention will be more explicit from the following detailed description taken with reference to the drawings wherein:

FIGS. 8A to 8C are sectional views showing states where abnormalities occur in the case where part of the ridge portion is removed in the method for manufacturing the semiconductor laser device.

DETAILED DESCRIPTION

Now referring to the drawings, preferred embodiments of the invention are described below.

Figure 1:
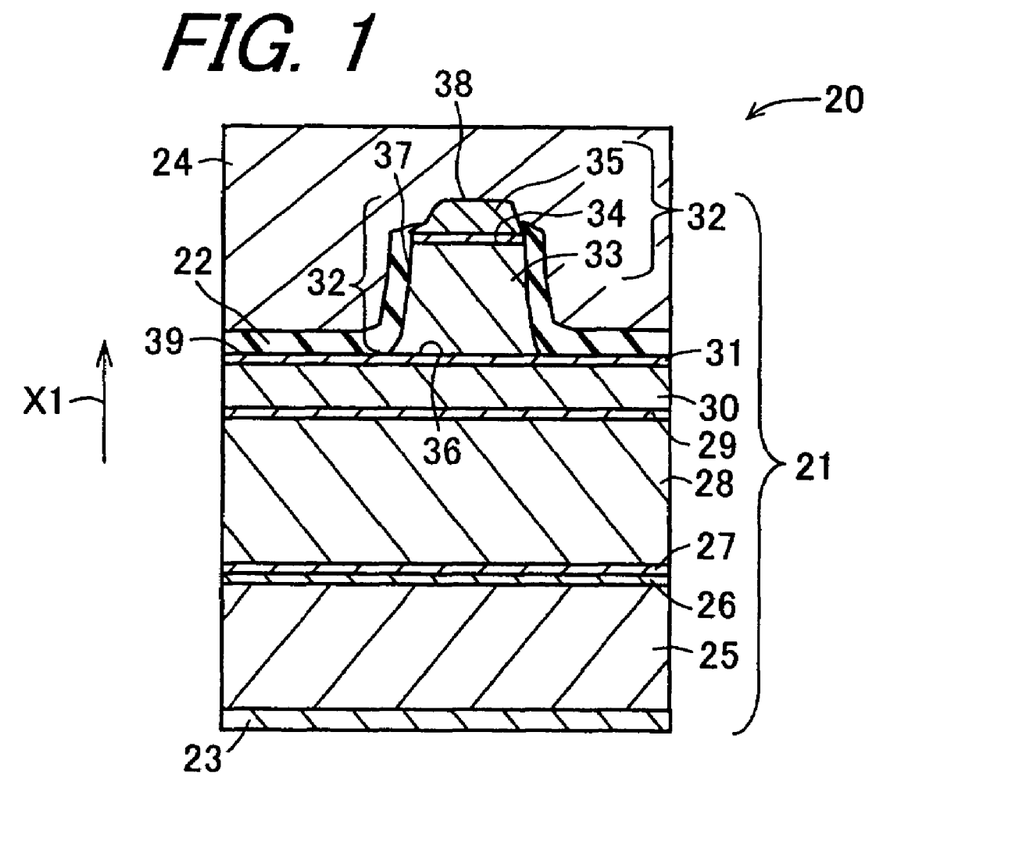
FIG. 1 is a sectional view showing a semiconductor laser device that is manufactured by a method for manufacturing the semiconductor laser device according to an embodiment of the invention.

FIG. 1 is a sectional view showing a semiconductor laser device 20 that is manufactured by a method for manufacturing the semiconductor laser device 20 according to an embodiment of the invention. The semiconductor laser device 20 is configured so as to be capable of emitting a laser beam when an electric current flows in the forward direction, and used in, for example, an optical pickup. The semiconductor laser device 20 comprises a compound semiconductor multilayer structure 21, a dielectric layer 22, an n-type electrode 23, and a p-type electrode 24.

The compound semiconductor multilayer structure 21 is configured in a manner that a first buffer layer 26, a second buffer layer 27, a first cladding layer 28, an active layer 29, a second cladding layer 30 and an etching stop layer 31 are sequentially laminated in a lamination direction X1 on a substrate 25 and a ridge portion 32 is disposed to the etching stop layer 31. The substrate 25 as a semiconductor substrate 25, on which a plurality of lamination substances can be laminated, is configured so as to be capable of coming into ohmic contact with the n-type electrode 23. The substrate 25 is made of n-type gallium arsenide (GaAs), for example.

The first buffer layer 26 is disposed in order to make the substrate 25 and the first cladding layer 28 that have different lattice intervals lattice-matching in cooperation with the second buffer layer 27. The first buffer layer 26 is made of n-type GaAs, for example. The second buffer layer 27 is disposed in order to match the lattices of the substrate 25 and the first cladding layer 28 that have different lattice intervals in cooperation with the first buffer layer 26. The second buffer layer 27 is made of n-type gallium indium phosphorus (GaInP), for example.

The first cladding layer 28 and the second cladding layer 30 are made of semiconductors whose forbidden bands are larger than that of the active layer 29, and disposed in order to confine carriers in the active layer 29. The first cladding layer 28 is the first-conductive-type cladding layer as well as an n-type cladding layer, and is made of, for example, n-type aluminum gallium indium phosphorus (AlGaInP). The second cladding layer 30 is the second-conductive-type first cladding layer as well as a p-type cladding layer, and is made of, for example, p-type AlGaInP.

The active layer 29 is configured so as to be capable of making electrons and positive holes, which are the confined carriers, radiation-recombined, amplifying a laser beam generated by the radiation recombination, and outputting outward. The active layer 29 is configured by a multi quantum well (abbreviated to MQW) structure, for example. The active layer 29 is made of GaInP/AlGaInP, for example.

The etching stop layer 31 is disposed in order to prevent that the second cladding layer 30 is etched at the time of etching. The etching stop layer 31 is made of p-type GaInP, for example.

The ridge portion 32 is formed by sequentially laminating a third cladding layer 33, an intermediate layer 34 and a cap layer 35. The ridge portion 32 is disposed in the middle in the width direction of a surface portion 36 facing the lamination direction X1 of the etching stop layer 31, and formed into a striped shape extending in the longitudinal direction. The ridge portion 32 is formed so that the length in the width direction thereof is shorter than the length in the width direction of the etching stop layer 31, and formed so as to become narrower by stages in the lamination direction X1. The ridge portion 32 is formed so that the cross section taken by cutting on a virtual plane perpendicular to the longitudinal direction has a substantially trapezoidal shape. The ridge portion 32 is disposed in order to concentrate carriers in one part in the width direction and inject into the active layer 29.

The third cladding layer 33 is the second-conductive-type second cladding layer, and is formed so as to become narrower continuously in the lamination direction X1. In concrete, the third cladding layer 33 is formed so that both the side surface portions in the width direction thereof are inclined with respect to the lamination direction X1 and both the side surface portions face the lamination direction X1. The third cladding layer 33 is made of a semiconductor whose forbidden band is larger than that of the active layer 29 in order to confine light in the active layer 29, in the same manner as the second cladding layer 30. The third cladding layer 33 formed in this manner is made of p-type AlGaInP, for example.

The intermediate layer 34 is the second-conductive-type intermediate band gap layer, formed so that the length in the width direction is fixed, and formed so that both the side surface portions in the width direction are substantially parallel to the lamination direction X1. "Substantially parallel" includes "parallel." The intermediate layer 34 is disposed in order to reduce a barrier generated between the third cladding layer 33 and the cap layer 35 whose forbidden bands are different, namely, in order to buffer discontinuity of the forbidden bands. The intermediate layer 34 is made of p-type GaInP, for example.

The cap layer 35 is the second-conductive-type cap layer, and is formed so as to become narrower continuously in the lamination direction X1. The cap layer 35 is formed so that both the side surface portions in the width direction thereof are inclined with respect to the lamination direction X1 and both the surface portions face the lamination direction X1. The cap layer 35 is disposed in order to come into ohmic contact with the p-type electrode 24. The cap layer 35 formed in this manner is made of p-type GaAs, for example.

The third cladding layer 33 and the cap layer 35 are formed so that the surface portions thereof facing the intermediate layer 34 have almost the same shapes as the surface portion perpendicular to the lamination direction X1 of the intermediate layer 34. Consequently, in the ridge portion 32, both surface portions 37 in the width direction are continuously formed by the third cladding layer 33, the intermediate layer 34 and the cap layer 35, and both the surface portions 37 in the width direction are formed so as to face the lamination direction X1 or become substantially parallel to the lamination direction X1, that is, formed so as to become narrower by stages.

On the surface portion facing the lamination direction X1 of the compound semiconductor multilayer structure 21, so as to cover a remaining portion (hereinafter, may be referred to as "the dielectric layer covering portion") 39 excluding a surface portion (hereinafter, may be referred to as "the ridge exposed surface portion") 38 facing the lamination direction X1 of the ridge portion 32, the thin-film dielectric layer 22 is laminated. The dielectric layer 22 is laminated so as to closely adhere to both the surface portions 37 in the width direction without a gap interposed between the dielectric layer and both the surface portions in the width direction of the ridge portion 32. The dielectric layer 22 is made of an insulating material, and is disposed in order to prevent that an electric current flows from an undesired position to the ridge portion 32 and the etching stop layer 31, and concentrate carriers to the ridge portion 32. The dielectric layer 22 is made of silicon oxide ($SiO_2$), for example.

On the substrate 25, so as to cover one surface portion opposed to another surface portion where the first buffer layer 26 is laminated, the thin-film n-type electrode 23 is laminated. The n-type electrode 23 is configured so as to be capable of coming into ohmic contact with the substrate 25, and disposed in order to flow an electric current to the compound semiconductor multilayer structure 21 in cooperation with the p-type electrode 24. On the ridge exposed surface portion 38 and the dielectric layer 22, so as to cover the ridge exposed surface portion 38 and the dielectric layer 22, the thin-film p-type electrode 24 is laminated. The p-type electrode 24 is configured so as to be capable of coming into ohmic contact with the cap layer 35, and disposed in order to flow an electric current to the compound semiconductor multilayer structure 21 in cooperation with the n-type electrode 23.

When bias is applied in the forward direction, carriers are guided to the active layer 29, and radiation recombination is performed in the active layer 29, whereby the semiconductor laser device 20 configured in this manner generates a laser beam. The laser beam is amplified in the active layer 29 and outputted from one side in the resonance direction, which is the longitudinal direction of the active layer 29, that is, the laser beam is emitted. Since the semiconductor laser device 20 is a so-called real refractive index guided semiconductor laser device 20 that has the dielectric layer 22 and the ridge portion 32, the semiconductor laser device is capable of concentrating injected carriers to a limited part of the active layer 29. Consequently, the semiconductor laser device 20 can emit a high-power laser beam. When a high-power laser beam is emitted in this manner, heat is generated accompanying radiation recombination and nonradiation recombination in the active layer 29 serving as a light-emitting portion. A method for manufacturing the semiconductor laser device 20 will be described hereinafter.

Figure 2:
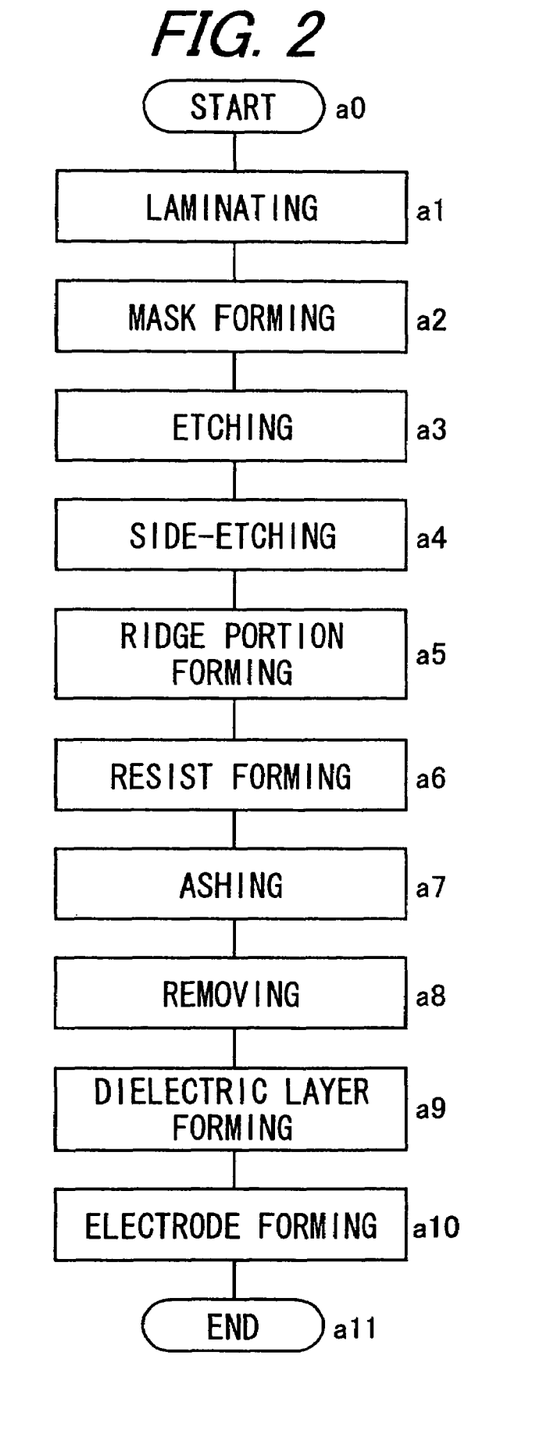
FIG. 2 is a flowchart showing the procedure of the method for manufacturing the semiconductor laser device.

FIG. 2 is a flowchart showing the procedure of the method for manufacturing the semiconductor laser device 20. FIGS. 3A to 3I are sectional views showing the procedure of the method for manufacturing the semiconductor laser device 20 by steps. The manufacturing procedure of the method for manufacturing the semiconductor laser device 20 includes a laminating step, a mask forming step, a side-etching step, a ridge portion forming step, a resist forming step, an ashing step, a removing step, a dielectric layer forming step, and an electrode forming step. The procedure of manufacturing the semiconductor laser device 20 is started when the substrate 25 is installed in a not-shown metal organic vapor phase epitaxy (abbreviated to MOVPE) apparatus, and the procedure goes from step a0 to step a1.

Figure 3A:
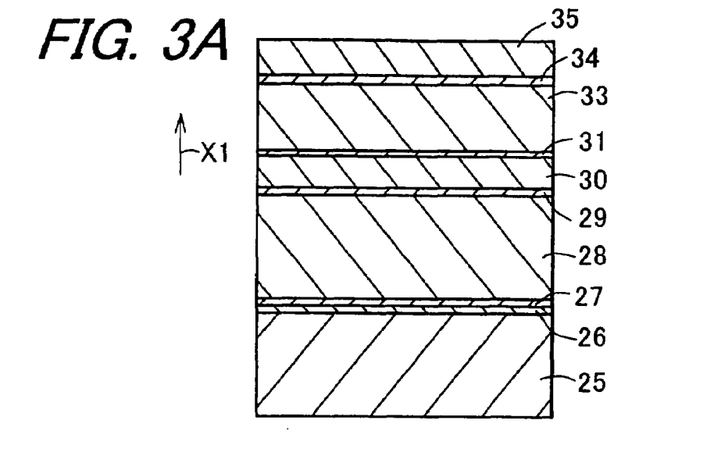
FIGS. 3A to 3I are sectional views showing the procedure of the method for manufacturing the semiconductor laser device by steps.

Step a1 is the laminating step and, as shown in FIG. 3A, on the substrate 25 installed in an MOVPE apparatus, the substrate 25 having a plane inclined 15° in the [011] direction from the (100) plane as a major plane, at least the first buffer layer 26, the second buffer layer 27, the first cladding layer 28, the active layer 29, the second cladding layer 30, the etching stop layer 31, the third cladding layer 33, the intermediate layer 34 and the cap layer 35 are laminated by crystal-growing by the MOVPE method in the lamination direction X1 sequentially, and the procedure goes to step a2. At step a1, a plurality of lamination substances are laminated, and a multilayer lamination substance structure is formed thereby, and the procedure goes to step a2.

Figure 3B:
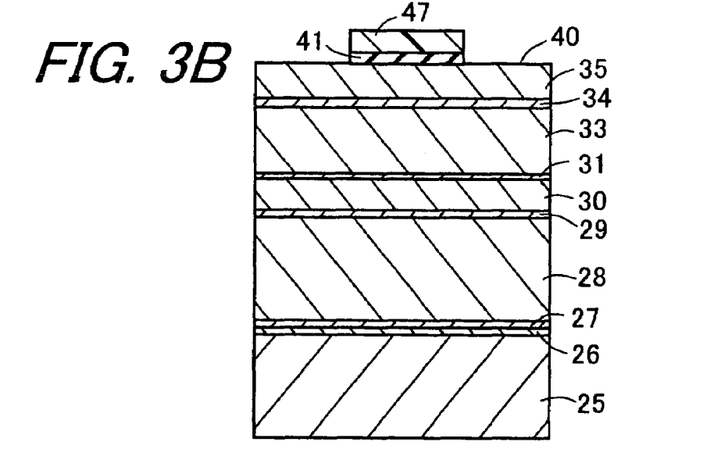

Step a2 is the mask forming step and, as shown in FIG. 3B, an etching mask 41 is formed by the use of lithography on a surface portion (hereinafter, may be referred to as "the etching surface portion") 40 facing the lamination direction X1, and the procedure goes to step a3. The etching mask 41 is disposed in order to form a precursor 42 of the ridge portion 32 by dry etching. A concrete method for forming the etching mask 41 is to evaporate a $SiO_2$ film 41 on the etching surface portion 40, perform resist pattern processing of a striped shape on the $SiO_2$ film by the photolithography method, etch the $SiO_2$ film by the reactive ion etching (abbreviated to RIE) method by using a resist pattern 47 as a mask, and remove the resist pattern 47, thereby forming the pattern of the $SiO_2$ film 41.

Figure 3C:
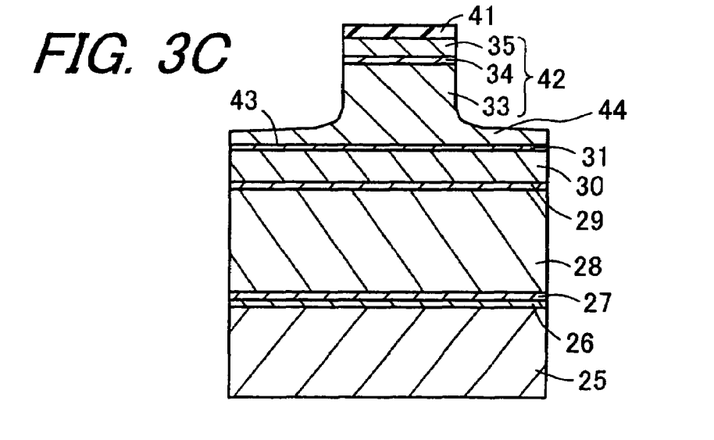

Step a3 is the etching step and, as shown in FIG. 3C, part of the third cladding layer 33, the intermediate layer 34 and the cap layer 35 is etched, and UV-$O_3$ ashing is performed for the purpose of oxidizing adherents adhering to the surfaces of the crystals after etching, and the procedure goes to step a4. As to part of the third cladding layer 33, the intermediate layer 34 and the cap layer 35, by using the pattern of the $SiO_2$ film as a mask and performing dry-etching of the multilayer lamination substance structure in a direction approaching the etching surface portion 40 from an opposed position to the etching surface portion 40 by the inductively coupled plasma (abbreviated to ICP) dry-etching method, the precursor 42 of the ridge portion 32 is formed. However, the method is not limited to the ICP etching method, and may be any dry-etching method.

The precursor 42 of the ridge portion 32 is formed into a substantially rectangular shape extending in the longitudinal direction in substance. At the end portion opposed to the etching stop layer 31 of the precursor 42 of the ridge portion 32, a covering portion 44 is formed, which is formed in a fan shape, that is, whose thickness increases from both the end portions in the width direction toward the middle portion of the precursor 42 of the ridge portion 32, and which covers a surface portion (hereinafter, may be referred to as "the ridge portion forming surface portion") 43 opposed to the ridge portion 32 of the etching stop layer 31.

Figure 3D:
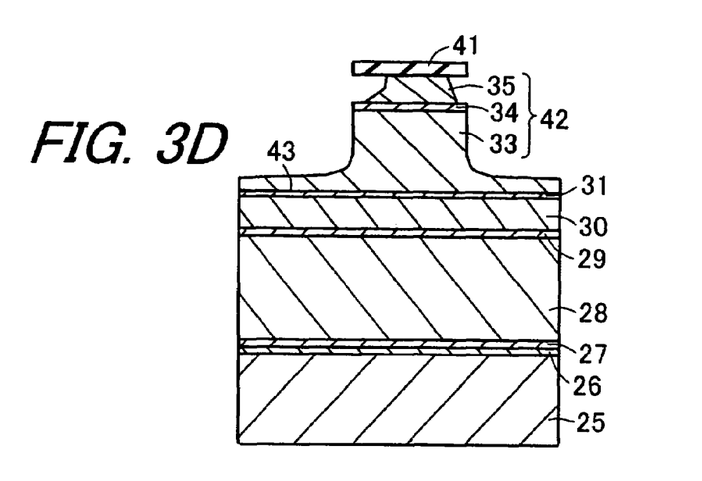

Step a4 is the side-etching step and, as shown in FIG. 3D, the cap layer 35 is side-etched, and adherents oxidized by ultraviolet rays (UV)-ozone ($O_3$) ashing after the side-etching is removed with buffered hydrofluoric acid, and the procedure goes to step a5. The precursor 42 of the ridge portion 32 is immersed into a bath of etchant of a sulfuric acid and hydrogen peroxide solution base, and the cap layer 35 is side-etched from both the end portions in the width direction to the center. The etchant of the sulfuric acid and hydrogen peroxide solution base is, for example, a mixture of sulfuric acid, a hydrogen peroxide solution and water, and is capable of wet-etching the cap layer 35, but it is difficult to wet-etch the intermediate layer 34, the third cladding layer 33 and the etching stop layer 31. Moreover, as surface treatment for stably performing etching, adherents oxidized by UV-$O_3$ ashing after the side-etching is removed with buffered hydrofluoric acid. At this moment, the $SiO_2$ film 41 is removed by the buffered hydrofluoric acid solution.

Figure 3E:
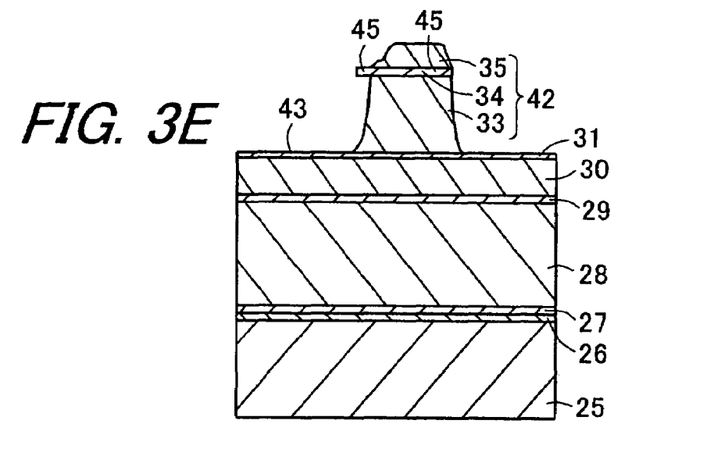

Step a5 is the ridge portion forming step and, as shown in FIG. 3E, a first etching step of etching the third cladding layer 33 and forming a ridge stripe structure having a protruding portion of the intermediate layer 34 is performed, and the procedure goes to step a6. The third cladding layer 33 is etched with an HF etching solution until the etching stops on the ridge portion forming surface portion 43 of the etching stop layer 31, whereby the ridge stripe structure, that is, the ridge portion 32 is formed.

A protruding portion 45 that can be formed at step a5, the protruding portion 45 being such that the intermediate layer 34 protrudes in a direction substantially perpendicular to the lamination direction from the third cladding layer 33 and the cap layer 35, is formed.

Figure 3F:
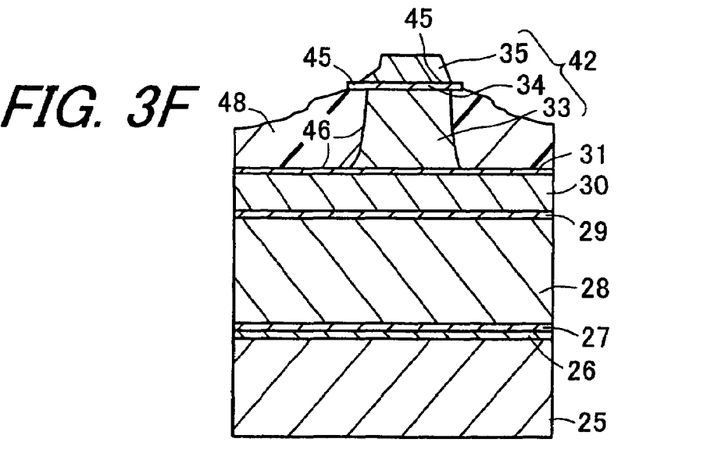

Step a6 is the resist forming step and, as shown in FIG. 3F, outer peripheral portions 46 facing the intermediate layer 34 of the second cladding layer 30 and the etching stop layer 31 are coated with a resist 48, and the procedure goes to step a7. On the etching stop layer 31, the resist 48 is formed by the use of lithography in a direction away from an opposed position to the etching stop layer 31 and the ridge portion 32. In concrete, the resist 48 is formed on the etching stop layer 31 so that only the surface portion facing the lamination direction and the outer peripheral portion in the width direction of the protruding portion 45 are exposed in a state where the third cladding layer 33 and the protruding portion 45 are buried. The resist 48 is applied on the whole surface of the etching stop layer 31, instant exposure is performed for, for example, 2.6 seconds, and only a part from the intermediate layer 34 in the lamination direction is exposed. The resist 48 is, for example, a positive resist, and concretely contains cresol novolak resin, diazo sensitizer or propylene glycol monomethyl ether acetate (methoxypropyl acetate) as chief ingredient.

Step a7 is the aching step for removing residues generated in the resist forming step mainly, where optical excitation ashing is performed and etching residues on the surface portion of the ridge portion 32 are removed, and the procedure goes to step a8. By optical excitation ashing, for example, ultraviolet rays (UV)-ozone ($O_3$) ashing, approximately 200 Å of the resist 48 is removed.

Figure 3G:
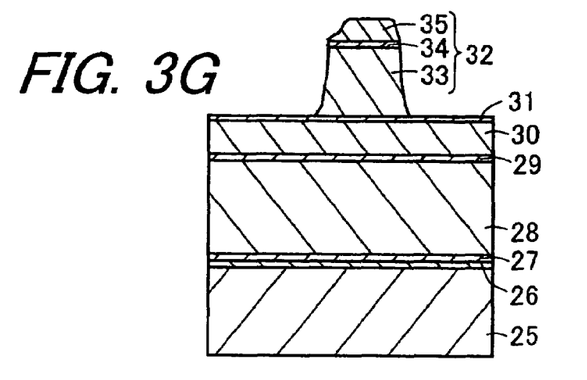

Step a8 is the removing step, as shown in FIG. 3G, the intermediate layer 34 and the cap layer 35 are etched to remove the protruding portion 45 and thereafter the resist 48 is removed, and the procedure goes to step a9. The protruding portion 45 is removed by performing etching by using the resist 48 formed in the aforementioned step as a mask. As the etching solution, for example, a mixture of saturated bromine water (SBW), phosphoric acid and water is used.

The combination ratio of SBW, phosphoric acid and water is not limited in specific, and can be selected from a wide range as needed, but the etching solution has such a characteristic as to etch the protruding portion 45 of the intermediate layer 34 as well as etch the cap layer 35. Therefore, an etching rate with respect to the cap layer 35 is regulated so that the protruding portion 45 of the intermediate layer 34 can be exhaustively and completely removed but the cap layer 35 is not etched undesirably. The etching amount of the cap layer 35 of the etching solution is accurately regulated to control ullage. It is preferred that the etching rate with respect to the cap layer 35 of the etching solution is 0.2 μm/minute or less.

Further, the temperature of the etching solution is not limited in specific and can be set as needed, but the temperature may be generally set to about 20° C., which is near room temperature and easy to treat. For example, the etching solution is adjusted so that the temperature is 20 degrees C. and the ratio of SBW, phosphoric acid and water is 2:1:250. The etching rate with respect to the cap layer 35 at this combination ratio is 0.02 μm/minute.

After the protruding portion 45 is removed by etching, the resist 48 is removed by, for example, a remover or ashing. Steps a6 to a8 are a second etching step and, as mentioned above, the protruding portion 45 is removed by etching.

Figure 3H:
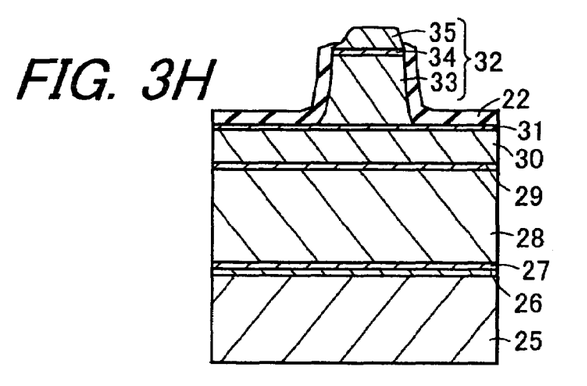

Step a9 is the dielectric layer forming step and, as shown in FIG. 3H, a dielectric layer is formed, and the procedure goes to step a10. At first, a precursor of the dielectric layer 22 is laminated, so as to cover the dielectric layer covering portion 39 and the ridge exposed surface portion 38. Subsequently, a portion formed in the lamination direction X1 of the ridge exposed surface portion 38 of the precursor of the dielectric layer 22 is removed by etching by photolithography, whereby the dielectric layer 22 is formed.

The precursor of the dielectric layer 22 is formed by the plasma chemical vapor deposition (abbreviated to PCVD) method, for example. Since both the side surface portions in the width direction of the ridge portion 32 are formed so as to face the lamination direction X1 or be substantially parallel to the lamination direction X1, the precursor of the dielectric layer 22 is substantially uniformly formed on the ridge portion 32 without variation of the layer thickness, and can be formed so as to closely adhere to the ridge portion 32.

Figure 3I:
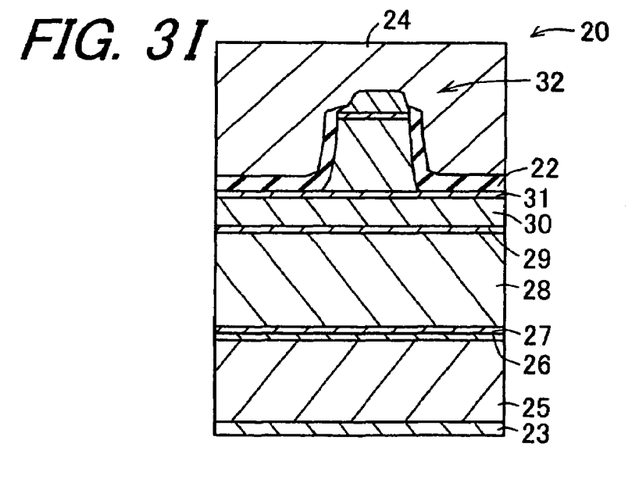

Step a10 is the electrode forming step and, as shown in FIG. 3I, electrodes are formed on the dielectric layer 22 and the substrate 25, and the procedure goes to step a11. On the dielectric layer 22 and the ridge exposed surface portion 38, the p-type electrode 24 is disposed so as to cover the dielectric layer 22 and the ridge exposed surface portion 38. On the substrate 25, the n-type electrode 23 is disposed so as to cover one surface portion opposed to another surface portion where the first buffer layer 26 of the substrate 25 is laminated. By disposing the electrodes 23, 24 in this manner, it is possible to form the semiconductor laser device 20 as shown in FIG. 3I. When the semiconductor laser device 20 is formed in this manner, the procedure goes to step a11, where manufacture of the semiconductor laser device 20 ends.

As described hereinbefore, the method for manufacturing the semiconductor laser device 20 of the present embodiment comprises the step of laminating, the step of etching, the step of side-etching, the first etching step, and the second etching step. Through these steps, the semiconductor laser device 20 having the ridge stripe structure 32 is manufactured. In the second etching step, the protruding portion 45 that can be formed in the first etching step, the protruding portion 45 being such that the intermediate layer 34 protrudes in a direction substantially perpendicular to the lamination direction from the third cladding layer 33 and the cap layer 35, is etched and removed.

The second etching step includes a stage of coating with the resist 48 at step a6, and a stage of etching at step a8. At the stage of coating with the resist 48, the outer peripheral portions 46 facing the intermediate layer 34 of the third cladding layer 33 and the etching stop layer 31 are coated with the resist 48. Consequently, it is possible to prevent that the third cladding layer 33 and the etching stop layer 31 are etched, and etch the intermediate layer 34. At the stage of etching, at least the third cladding layer 33 is removed inevitably, and the intermediate layer 34 and the cap layer 35 are etched. Consequently, it is possible to remove the protruding portion 45 of the intermediate layer 34, and it is possible to prevent that the cap layer 35 is etched undesirably.

As a result, it is possible to, without etching the third cladding layer 33 and the cap layer 35 undesirably, inhibit deformation of the third cladding layer 33 and the cap layer 35 as far as possible, and securely remove only the protruding portion 45 by etching. In short, it becomes possible to inhibit deformation of the cap layer 35 and the third layer 33, and remove the protruding portion 45 of the intermediate layer 34. Therefore, it is possible to produce a ridge portion without irregularities with respect to a direction substantially perpendicular to the lamination direction. Accordingly, it is possible to prevent increase of an operation voltage and decrease of external differential quantum efficiency. Consequently, it is possible to manufacture the semiconductor laser device 20 that operates at a stable low operation electric current. In specific, it becomes possible to obtain the semiconductor laser device 20 that operates at a stable low operation electric current even in a high temperature environment accompanying a laser beam becoming high-power. Moreover, in the present embodiment, the intermediate layer 34 is made of GaInP crystals, and the cap layer 35 is made of GaAs crystals. Therefore, it is possible to realize a manufacturing method in which the protruding portion 45 of the intermediate layer 34 is etched and the remaining portion is not etched undesirably.

Further, in the present embodiment, the etching solution used in the second etching step is a mixture of saturated bromine water, phosphoric acid and water. It is possible to realize such an etching solution that etches the protruding portion 45 of the intermediate layer 34 and does not etch the remaining portion undesirably.

Further, in the second etching step, by using the mixture of saturated bromine water, phosphoric acid and water as an etching solution, it is possible to make the etching solution harder to penetrate into a gap between the third cladding layer 33 and the resist 48 than etching solutions of existing techniques. Consequently, it is possible to prevent that the etching solution etches the third cladding layer 33 undesirably.

Further, in the case of the existing etching solutions, there is a fear that an unexpected etching abnormality that cannot be explained at an original etching rate occurs and the cap layer 35 is partially lost, but in the case of the mixture of saturated bromine water, phosphoric acid and water, it is possible to prevent that such an etching abnormality occurs.

Further, in the present embodiment, the second etching step further includes a stage of performing optical excitation ashing corresponding to step a7 between the stage of coating with the resist 48 corresponding to step a6 and the stage of etching corresponding to step a8. By performing optical excitation ashing, it is possible to remove undesirable extraneous matter that may become an obstacle at the time of etching. In other words, by positively applying optical excitation ashing at a pre-etching stage, it becomes possible to effectively remove extraneous matter that becomes an obstacle at the time of etching. Therefore, it is possible to etch with high accuracy. Consequently, it is possible to prevent that the cap layer 35 is etched undesirably as far as possible. Besides, by applying the optical excitation ashing, no damage due to charged particles of plasma as in plasma ashing is caused.

Figure 4:
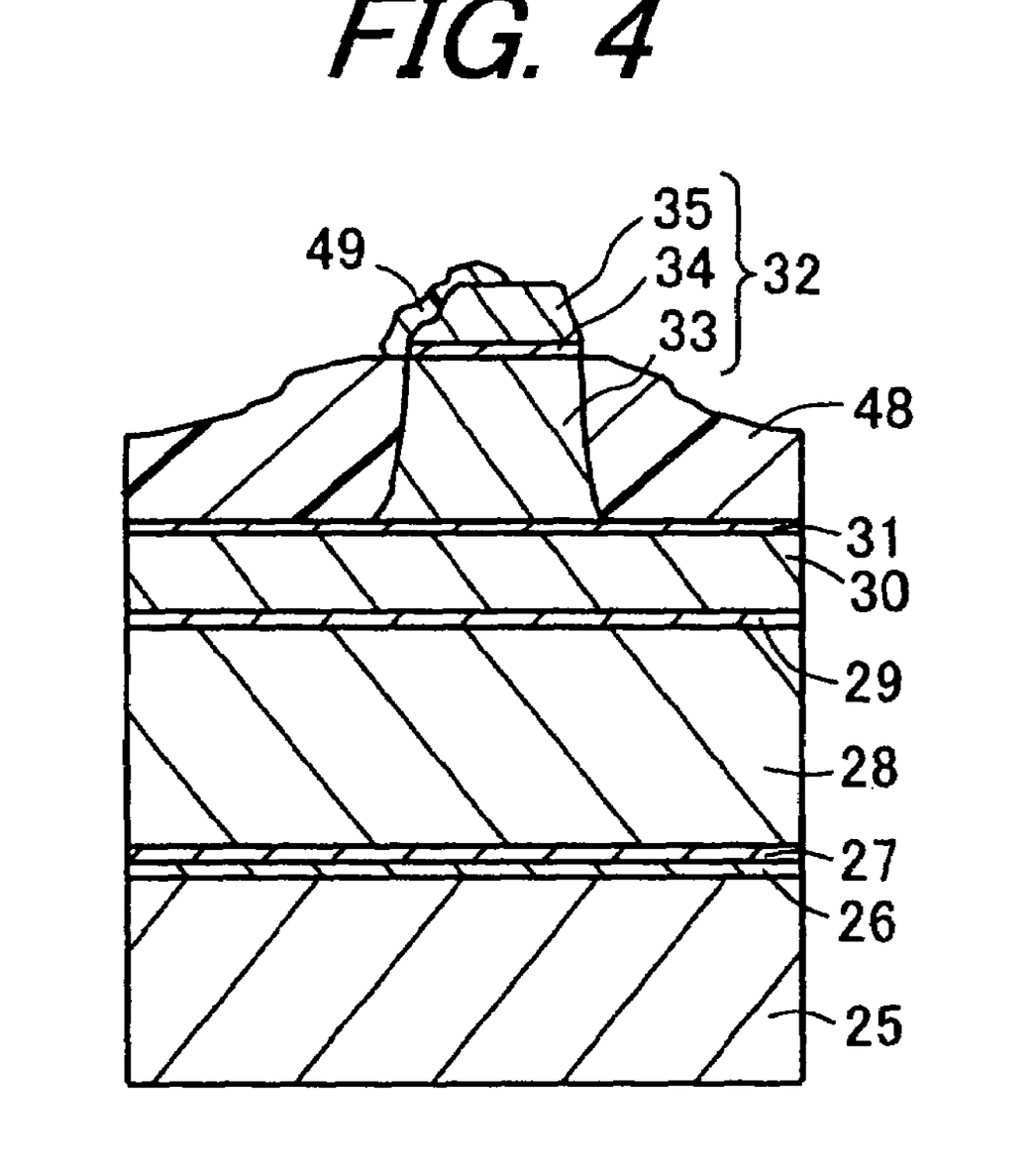
FIG. 4 is a sectional view showing a state at a stage of manufacturing the semiconductor laser device in the case of performing the removing step at step a8 without performing the ashing step at step a7.

FIG. 4 is a sectional view showing a state at a stage of manufacturing the semiconductor laser device 20 in the case of performing the removing step at step a8 without performing the ashing step at step a7. As shown in FIG. 4, etching residual 49 is generated on the surface portion of the ridge portion 32 after etching. It is considered that residual is generated somehow on the surface in the resist forming step corresponding to step a6 before etching and the residual becomes visible due to etching with an etching solution. It is considerably difficult to remove the etching residual 49 once generated. By performing the ashing step at step a7, it is possible to securely remove the residual generated somehow in the resist forming step, and form a fine ridge portion 32.

Further, in the present embodiment, the mixture ratio of saturated bromine water, phosphoric acid and water of the etching solution is selected so that the etching rate for etching the cap layer 35 becomes 0.2 μm/minute or less. By selecting the etching rate in this manner, it is possible to prevent that the cap layer 35 is etched undesirably, and remove the protruding portion 45 by etching.

The aforementioned embodiment merely exemplifies the invention, and it is possible to change the configuration within the scope of the invention. In the ashing step of the embodiment, the substrate 25 may be heated to increase the ashing speed. Consequently, it is possible to shorten a tact time to manufacture the semiconductor laser device. The aforementioned "inevitably remove the third cladding layer 33" is synonymous with that there is a case where the third cladding layer 33 is slightly etched to the degree that the performance thereof is not deteriorated.

In the aforementioned embodiment, the first-conductive-type is realized by an n-type semiconductor material, and the second-conductive-type is realized by a p-type semiconductor material, but not limited to the above, the first-conductive-type may be realized by a p-type semiconductor material, and the second-conductive-type may be realized by an n-type semiconductor material.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method for manufacturing a semiconductor laser device comprising:
sequentially laminating, on a substrate, at least a first-conductive-type cladding layer, an active layer, a second-conductive-type first cladding layer, an etching stop layer, a second-conductive type second cladding layer, a second-conductive-type intermediate band gap layer and a second-conductive-type cap layer;
etching part of the second-conductive-type cap layer, the second-conductive-type intermediate band gap layer and the second-conductive-type second cladding layer;
side-etching the second-conductive-type cap layer;
etching the second-conductive-type second cladding layer and forming a ridge stripe structure having a protruding portion of the second-conductive-type intermediate band gap layer; and etching and removing the protruding portion formed when etching the second-conductive-type second cladding layer, the protruding portion being such that the second-conductive-type intermediate band gap layer protrudes in a direction substantially perpendicular to a lamination direction from the second-conductive-type second cladding layer and the second-conductive-type cap layer, wherein the-etching and removing of the protruding portion includes:

coating outer peripheral portions facing the second-conductive-type intermediate band gap layer of the second-conductive-type second cladding layer and the etching stop layer with a resist, and etching the second-conductive-type intermediate band gap layer and the second-conductive-type cap layer, wherein the second-conductive-type second cladding layer is not removed.

2. The method of claim 1, wherein the second-conductive-type intermediate band gap layer is made of GaInP crystals, and the second-conductive-type cap layer is made of GaAs crystals.

3. The method of claim 1, wherein an etching solution used in the etching and removing of the protruding portion is a mixture of saturated bromine water, phosphoric acid and water.

4. The method of claim 1, wherein the etching and removing of the protruding portion further includes performing optical excitation ashing between the coating with the resist and the etching.

5. The method of claim 3, wherein a mixture ratio of saturated bromine water, phosphoric acid and water of the etching solution is selected so that an etching rate for etching the second-conductive-type cap layer becomes 0.2 μm/minute or less.

* * * * *